(12) United States Patent
Hirata

(10) Patent No.: US 7,312,517 B2
(45) Date of Patent: Dec. 25, 2007

(54) SYSTEM-IN-PACKAGE TYPE SEMICONDUCTOR DEVICE

(75) Inventor: Morihisa Hirata, Kanagawa (JP)

(73) Assignee: NEC Electronics Corporation, Kawasaki, Kanagawa (JP)

(*) Notice: Subject to any disclaimer, the term of this patent is extended or adjusted under 35 U.S.C. 154(b) by 197 days.

(21) Appl. No.: 11/244,877

(22) Filed: Oct. 6, 2005

(65) Prior Publication Data

US 2006/0103421 A1 May 18, 2006

Related U.S. Application Data

(63) Continuation-in-part of application No. 10/784,620, filed on Feb. 23, 2004, now Pat. No. 7,076,757.

(30) Foreign Application Priority Data

| Feb. 27, 2003 | (JP) | ............................. 2003-050251 |
| Oct. 7, 2004 | (JP) | ............................. 2004-50744 |

(51) Int. Cl.
*H01L 23/02* (2006.01)
*H01L 23/34* (2006.01)
*H01L 23/48* (2006.01)
*H01L 23/52* (2006.01)
*H01L 29/40* (2006.01)

(52) U.S. Cl. ...................... 257/678; 257/685; 257/723; 257/777; 361/56; 361/91.1; 361/111; 716/1; 716/8; 716/9; 716/10; 716/11; 716/12; 716/13

(58) Field of Classification Search ................. 257/678, 257/685, 723, 777; 716/1, 8–13; 361/56, 361/91.1, 111
See application file for complete search history.

(56) References Cited

U.S. PATENT DOCUMENTS

| 5,886,558 | A | 3/1999 | Iijima et al. | |
| 2002/0105062 | A1* | 8/2002 | Kikuchi et al. | ............. 257/666 |
| 2003/0141926 | A1* | 7/2003 | Mizuno et al. | ............. 327/565 |
| 2005/0029648 | A1* | 2/2005 | Suwa et al. | ................. 257/690 |
| 2006/0176101 | A1* | 8/2006 | Mizuno et al. | ............. 327/535 |

* cited by examiner

*Primary Examiner*—Ida M. Soward
(74) *Attorney, Agent, or Firm*—Muirhead and Saturnelli, LLC

(57) ABSTRACT

A system-in-package type semiconductor device includes a plurality of semiconductor chips, a first semiconductor chip 1110 to which electric power is supplied from first power supply wiring 1111, and first ground wiring 1112 to which the first circuit unit is coupled. Moreover, the system-in-package type semiconductor device includes a second semiconductor chip 1120 to which electric power is supplied from second power supply wiring 1124, and second ground wiring 1125 coupled to the second circuit unit. The first semiconductor chip includes a first interface circuit unit 1412, and the second circuit unit includes a second interface circuit unit 1121 configured to perform inputting or outputting of a signal to and from the first interface circuit unit. The first ground wiring 1414 is coupled to the second ground wiring 1424 through a protection circuit 1442, and the second interface circuit unit is placed in the vicinity of the first interface circuit unit.

7 Claims, 12 Drawing Sheets

SYSTEM-IN-PACKAGE TYPE SEMICONDUCTOR DEVICE

This application is a continuation-in-part of patent application Ser. No. 10/784,620 filed on Feb. 23, 2004 now U.S. Pat. No. 7,076,757.

BACKGROUND OF THE INVENTION

1. Field of the Invention

The present invention relates to a semiconductor integrated device, more specifically, to a system-in-package type semiconductor device including a plurality of semiconductor chips to be operated by a plurality of power supplies.

2. Description of the Prior Art

Along with an increase in cell density of a semiconductor integrated device (hereinafter abbreviated as an "LSI") and advance in the digital technology in recent years, circuits including digital circuits and analog circuits in single semiconductor devices are embedded in many products. In a digital camera or video equipment, for example, a DA converter and an AD converter for converting signals between analog signals and digital signals are embedded as a single semiconductor device.

Each of the digital circuit and the analog circuit embedded in the single semiconductor device is operated by a plurality of different power systems. Moreover, when the circuits operated by the plurality of different power systems are placed on the single semiconductor device, the semiconductor device requires a design in terms of electrostatic discharge (ESD) designing which is different from the ESD designing for a circuit including a single power system.

In particular, as miniaturization of an LSI progresses, the ESD designing in consideration of the miniaturization requires many processes at design and development stages. Accordingly, an increase in the development period is unignorable.

As described above, in order to prevent damage by electrostatic discharge in an LSI device including two or more sets of power supply wiring, there are known various aspects of inserting an ESD protection element between high-potential power supply wiring and a low-potential power supply wiring. A typical technique thereof is disclosed in Japanese Unexamined Patent Publication No. 9(1997)-172146, for example.

An LSI device in this prior art includes first and second power supply lines. Moreover, a high-potential side of the first power supply line and a high-potential side of the second power supply line are separated; meanwhile, a low-potential side of the first power supply line is coupled to a low-potential side of the second power supply line through a protection circuit (HK).

In this way, destruction of an element inside a second circuit attributable to a rise in electric potential on the low-potential side of the first power supply line is prevented. Besides, there are also known a technique to couple a high-potential side of a power system to a low-potential side of a different power system through a protection element, a technique to couple a protection element between a signal line of a first power system and a ground line of a second power system, and the like.

However, the present inventor has recognized that the prior part did not consider nodes of respective circuits on the high-potential side of the power supply line or on the low-potential side of the power supply line. Accordingly, this prior art causes variation of ESD tolerance and it is therefore difficult to manufacture an LSI with sufficient ESD tolerance.

Moreover, in terms of a circuit chip including an analog function cell and a digital circuit using different power supplies, there is also known a technique to insert a level conversion circuit for performing level conversion between an input/output signal of an analog function circuit and an input/output signal of the digital circuit, which is configured to draw in both of the power supply to be supplied to the analog function cell and the power supply to be supplied to the digital circuit. For example, the technique to insert the level conversion circuit is disclosed in Japanese Unexamined Patent Publication No. 10(1998)-150364.

The present inventor has recognized that this technique was a technique concerning optimization of a circuit area and was not designed in light of improvement in the ESD tolerance. Accordingly, occurrence of wiring resistance or wiring delay is unignorable, and the ESD tolerance is thereby varied.

SIP (System-in-package type semiconductor device) for mounting a plurality of chips on one package is noticed in addition to the SoC (System on Chip) technique for forming a plurality of different circuit portions in one chip. The SIP is provided with a plurality of chips and the chips are laminated or arranged in parallel in one package. The chips are connected through an inter-chip connection wiring. The inter-chip connection wiring is constituted of an internal wiring of an assembly substrate or a bump for directly connecting chips. In the case of the SIP, it is necessary to consider not only ESD current in a conventional chip but also ESD current flowing between chips.

Therefore, it is an object of the present invention to provide an LSI device, which is capable of effectively suppressing ESD destruction thereof.

SUMMARY OF THE INVENTION

A system-in-package type semiconductor device according to a first aspect of the present invention, comprising: a first semiconductor chip to which electric power is supplied from a first power supply wiring and a second power supply wiring; a second semiconductor chip to which electric power is supplied from a third power supply wiring and a fourth power supply wiring; a first interface circuit unit formed in the first semiconductor chip; and a second interface circuit unit formed in the second semiconductor chip, the second interface circuit unit being configured to perform any of inputting and outputting a signal to and from the first interface circuit unit, wherein the second power supply wiring is coupled through at least a first protection circuit configured to be conductive at a given voltage or above, to the fourth power supply wiring at a node. By adopting this configuration, it is possible to reduce the wiring resistance and thereby to suppress an influence of an ESD current.

In addition, a system-in-package type semiconductor device according to a second aspect of the present invention, further comprising: an external connection terminal coupled to the fourth power supply wiring, and wherein a node for the external connection terminal and the fourth power supply wiring is located between a node for the second interface circuit unit and the fourth power supply wiring and the node for the second power supply wiring and the fourth power supply wiring. By adopting this configuration, the ESD surge current path bypassing the second interface circuit unit is formed by connecting the external connection terminal of the fourth power supply wiring with the second power supply wiring, and it is possible to suppress an influence by the ESD surge to the second interface circuit unit.

BRIEF DESCRIPTION OF THE DRAWINGS

The above and other objects, advantages and features of the present invention will be more apparent from the following description taken in conjunction with the accompanying drawings, in which.

DETAILED DESCRIPTION OF THE PREFERRED EMBODIMENTS

Figure 1:
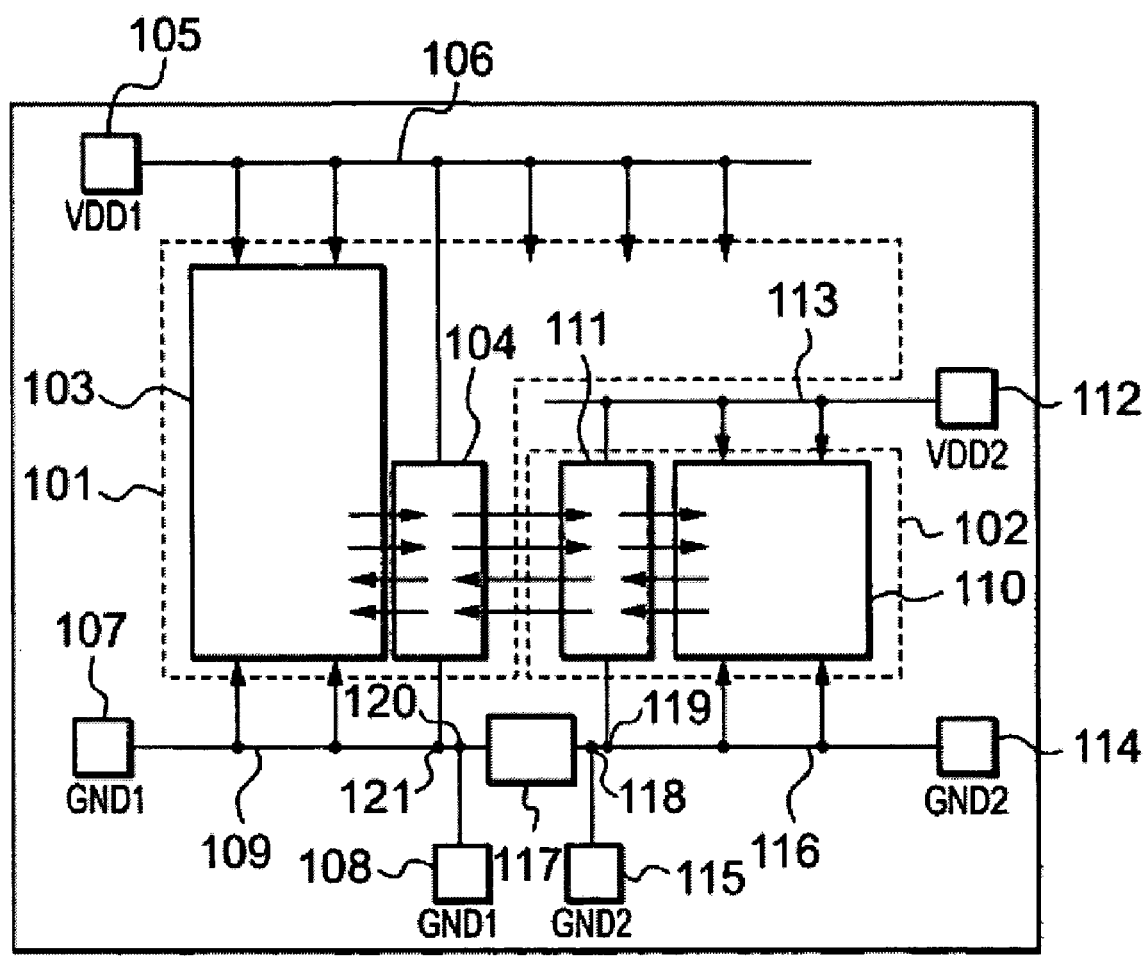
FIG. 1 depicts a circuit configuration of an LSI device according to a first embodiment of the present invention.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Firstly, embodiments of an LSI device of the present invention will be described in detail with reference to the accompanying drawings.

In the respective drawings, elements designated by the same reference numerals denote the same elements, and duplicate explanations will be omitted as appropriate. The following description is provided for explaining the embodiments of the present invention and it is to be noted that the present invention shall not be limited only by the following embodiments. For the purpose of clarification of the explanations, the following description will be abridged or simplified when appropriate. Moreover, for those skilled in the art, it is easily possible to modify, add, and/or substitute the respective elements in the following embodiments within the scope of the present invention.

First Embodiment

FIG. 1 is a block diagram for describing a schematic circuit configuration of an LSI device according to a first embodiment. With reference to FIG. 1, the LSI device of the first embodiment includes a first power system circuit unit 101 which is operated by electric power supplied from a first power system, and a second power system circuit unit 102 which is operated by electric power supplied from a second power system.

Typical examples of the first power system circuit unit and the second power system circuit unit are a digital circuit unit and an analog circuit unit to be placed in an LSI chip. Other examples may include an LSI device configured to use different power systems between a digital internal circuit and an input/output interface circuit unit.

Moreover, the digital circuit unit, for instance, has a larger number of elements than the analog circuit unit, and the digital circuit unit, also, has a larger chip area than the analog circuit unit.

In a hybrid circuit configured to incorporate the digital circuit unit and the analog circuit unit into a one-chip LSI device, a power pad and a ground pad of the analog circuit unit are provided differently from a power pad and a ground pad of the digital circuit unit so as to suppress deterioration in characteristics of the analog circuit attributable to noise components generated in the digital circuit unit. Moreover, a circuit inside the digital circuit unit and a circuit inside the analog circuit unit include different power supply wiring and ground wiring, whereby the digital circuit unit and the analog circuit unit are operated as different power systems.

The circuit configuration of FIG. 1 will be now described. The first power supply system circuit unit 101 of the LSI device according to the first embodiment includes a first power supply system internal circuit unit 103 in which signal exchanges are carried out among the elements that are supplied the electric power by the first power supply, and a first power supply system input/output circuit unit 104 in which signal exchanges are carried out among the elements that are supplied the electric power by the second power supply.

The LSI device of the first embodiment includes a first power system power pad 105 to which a first power voltage (VDD1) is supplied from a power supply arranged outside the circuit, and first power system power supply wiring 106 coupled to the first power system power pad 105 for transmitting the power voltage to be supplied from the first power system power pad 105.

The first power system internal circuit 103 and the first power system input/output circuit 104 are coupled to the first power system power supply wiring 106, and the necessary electric power is supplied thereto. The LSI device according to the first embodiment further includes first power system ground pads (107 and 108) coupled to a ground circuit unit outside the circuit and provided with ground potential (GND1).

In other words, the first power system circuit unit 101 of this embodiment includes the two ground pads.

The LSI device according to the first embodiment further includes first power system ground wiring 109 coupled to the first power system ground pads 107 and 108 and configured to provide the ground potential to the first power system circuit unit 101. The first power system internal circuit 103 and the first power system input/output circuit 104 are coupled to the first power system ground wiring 109, whereby the necessary ground potential is supplied thereto.

The second power supply system circuit unit 102 includes a second power system internal circuit unit 110 in which signal exchanges are carried out among the elements that are supplied the electric power by the second power supply, and a second power supply system input/output circuit unit 111 in which signal exchanges are carried out among the elements that are supplied the electric power by the first power supply.

Moreover, the LSI device of the first embodiment includes a second power system power pad 112 to which a second power voltage (VDD2) is supplied from a power supply arranged outside the circuit, and second power system power supply wiring 113 coupled to the second power system power pad 112 for transmitting the power voltage to be supplied from the second power system power pad 112.

Each of the first power system input/output circuit and the second power system input/output circuit is an example of an interface circuit. The interface circuit includes a circuit configured to perform any one of input and output, or a circuit configured to perform both input and output.

The second power system internal circuit 110 and the second power system input/output circuit 111 are coupled to the second power system power supply wiring 113, and the necessary electric power is supplied thereto. Second power system ground pads (114 and 115) are coupled to a ground circuit unit outside the circuit and provided with ground potential (GND2). The second power system of this embodiment includes the two ground pads. Second power system ground wiring 116 for providing the ground potential to the second power system circuit 102 is coupled to the second power system ground pads 114 and 115.

The second power system internal circuit 110 and the second power system input/output circuit 111 are coupled to the second power system ground wiring 116, whereby the necessary ground potential is supplied thereto.

The first power system ground wiring 109 is coupled to the second power system ground wiring 116 through an electrostatic discharge (ESD) protection element 117. The protection element 117 includes a function to conduct the two sets of ground wiring and to flow an electric current therebetween when electric potential between the sets of the ground wiring reaches a predetermined value. The ESD protection element 117 is preferably bidirectional, and a transistor, a bidirectional diode or the like can be used.

Here, the protection element 117 can be used when the element is necessary according to the circuit design. The protection element 117 is particularly useful for suppressing unfavorable interactions between the analog circuit and the digital circuit, for example, when digital noises are likely to affect the analog circuit. When the protection element is not necessary, the first power system ground wiring can be coupled to the second power system ground wiring through a node where no particular element is placed. Such a node only needs to be a point in a circuit and is not limited to a point which is visually recognizable.

Moreover, the values of the electric potential on the two power system may be either different or identical. Whereas the ground potential is set to a value lower than the power supply potential, those potential values are appropriately determined by designing. The values of the ground potential to be provided to the two power system may be either identical or different in accordance with the circuit design. Moreover, although it is not shown in FIG. 1, the first power system power supply wiring 106 can be coupled to the first power system ground wiring 109 through a power supply protection circuit. Similarly, the second power system power supply wiring 113 can be coupled to the second power system ground wiring 116 through a power supply protection circuit. The aspects described above will also apply to other embodiments to be described later.

An influence by an ESD surge from outside which can cause electrostatic destruction of an LSI chip will be described with reference to FIG. 2. An LSI chip can incur electrostatic destruction by an ESD surge which is inputted from outside through a pad. To describe the electrostatic destruction caused by the ESD surge from the outside, description will be made below concerning electric potential inside the circuit when an ESD surge current flows from the first power system power pad to the second power system ground pad.

Description will be now made on the case when the ESD surge current flows from the first power system power pad to the second power system ground pad in the LSI of this embodiment. One of factors for the electrostatic destruction of the LSI is destruction of a gate oxide film of a MOS transistor. In the LSI device including the circuits in the different power systems, MOS transistors in the input/output circuit units between the circuits units in the different power systems; more particularly, destruction of a gate oxide film of the MOS transistor on the input side becomes a problem.

Figure 2:
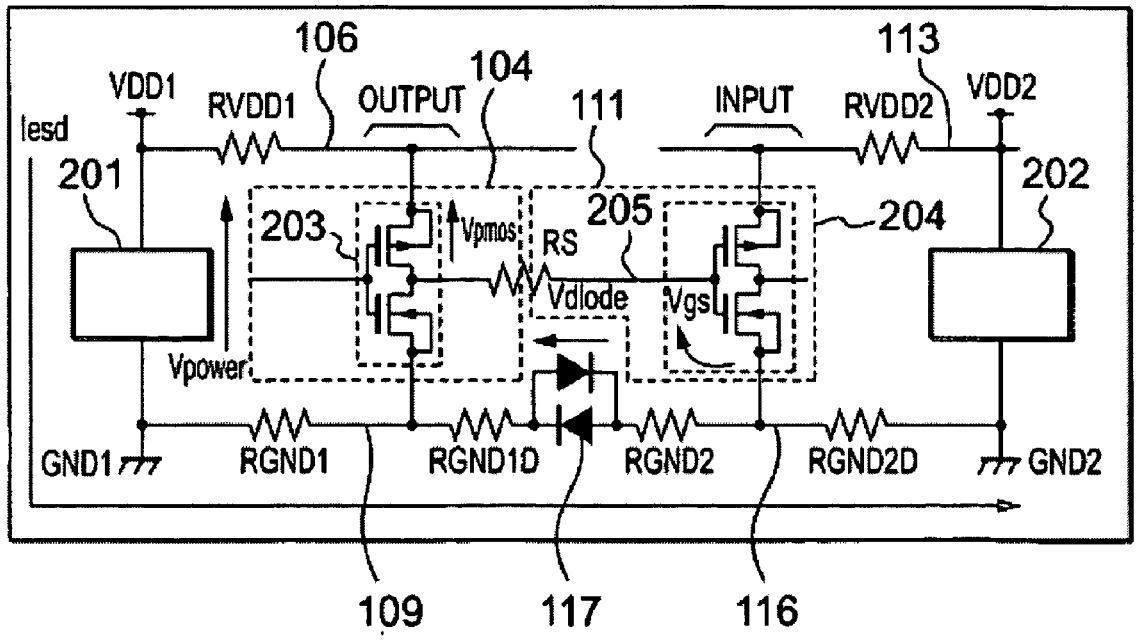
FIG. 2 depicts an influence of an ESD surge current in the LSI device of the first embodiment.

FIG. 2 is a circuit diagram for explaining the influence by the ESD surge current in this embodiment. Here, a simplified circuit is described for the purpose of clarifying the explanation.

With reference to FIG. 2, the elements designated by the same reference numerals as those in FIG. 1 are similar to the elements described in FIG. 1, and duplicate explanations will be omitted herein.

In FIG. 2, the first power system input/output circuit is defined as an output side, and the second power system input/output circuit is defined as an input side. Note that the input/output circuit corresponds to a final stage of a primitive block inside the LSI circuit, and is therefore different from an input/output circuit unit outside the LSI. A power supply protection circuit 201 is coupled between the first power system power supply wiring and the first power system ground wiring, and a power supply protection circuit 202 is coupled between the second power system power supply wiring and the second power system ground wiring. An output inverter 203 contained in the first power system input/output circuit unit 104 is a CMOS circuit which includes a PMOS to be coupled to the first power system power supply wiring 106 and an NMOS to be coupled to the first power system ground wiring 109. An input inverter 204 contained in the second power system input/output circuit unit 111 is a CMOS circuit which includes a PMOS to be coupled to the second power system power supply wiring 113 and an NMOS to be coupled to the second power system ground wiring 116. Signal wiring 205 couples the CMOS in the first power system to the CMOS in the second power system.

An applied potential difference between a gate and a source of the NMOS transistor in the second power system is defined as Vgs, and an applied potential difference between a source and drain of the PMOS transistor in the first power system is defined as Vpmos. Moreover, a clamp voltage of the power supply protection circuit 201 in the first power system is defined as Vpower, and a clamp voltage by the protection element 117 between the sets of the ground wiring in the first and second power systems is defined as Vdiode. Meanwhile, resistance of the first power system ground wiring from the first power system power supply protection circuit 201 to the first power system output inverter 203 is defined as RGND1, and resistance of the first power system ground wiring from the first power system output inverter 203 to the protection element 117 placed between the sets of the ground wiring is defined as RGND1D. Furthermore, resistance of the second power system ground wiring from the protection element 117 placed between the sets of the ground wiring to the second power system input inverter 204 is defined as RGND2, and resistance of the second power system ground wiring from the second power system input inverter 204 to a GND pad 2 is defined as RGND2D.

When an ESD surge current is applied between the first power system power pad 105 and the second power system ground pad 114, the first power system power supply protection circuit 201 is turned on and the ESD surge current (Iesd) flows thereon. Examination will be made below on the case where the ESD surge current flows on the following path of the first power system power pad 105→the first power system power supply protection circuit 201→the first power system ground wiring 109→the protection element 117 between the set of the ground wiring→the second power system ground wiring 116.fwdarw. the second power system ground pad 114.

When the ESD surge is applied, a potential difference is generated inside the chip because of a voltage drop attributable to the wiring resistance existing on the path of the flow of the ESD surge current. When the ESD surge is applied between the first power system power pad 105 and the second power system ground pad 114, the voltage vgs to be applied between the gate and the source of the NMOS of the second power system is calculated by:

$Vgs=(Vpower+RGND1*Iesd+RGND1D*Iesd+Vdiode+RGND2D*Iesd)-Vpmos$

A breakdown voltage of the applied potential difference (Vgs) of the NMOS transistor is defined as Vgs.max. To protect the NMOS from destruction due tot the breakdown voltage of the applied potential difference (Vgs) of the NMOS transistor, it is necessary to design the LSI such that the voltage Vgs does not exceed the breakdown voltage Vgs.max.

In the 130-nm class CMOS process, the thickness of the gate oxide film of the MOS transistor is about Tox=2 nm. Typically, destruction of the gate oxide film occurs when a potential difference of about 6V is applied to the gate oxide film. When an ESD surge at 2000V is applied in accordance with the human body model (HBM) standard, the peak of the ESD surge current Iesd is equal to 1.3 A. To pass an ESD tolerance test at 2000V in accordance with the HBM standard, it is necessary to design the LSI such that the voltage Vgs does not exceed 6 V even if this ESD surge current flows inside the LSI.

For example, when the clamp voltage Vpower of the power supply protection circuit is equal to 3.5V, the clamp voltage Vdiode of a protection diode between the sets of the ground wiring is equal to 1.2V, and the voltage Vpmos between the source and the drain of the PMOS of the output inverter is equal to 0V, the ground wiring resistance needs to satisfy:

$RGND1+RGND1D+RGND2D \leqq (6V-3.5V-1.2V)/1.3$
$A=1.0\ \Omega.$

As described above, when the ESD surge is applied, one of critical elements is to reduce the ground wiring resistance in the path for flowing the ESD surge current.

Next, the circuit configuration will be now described in a case which the ground wiring GND1 is directly coupled to the ground wiring GND2 without the protection device 117. In this case, a connection node between the ground wiring GND1 and the ground wiring GND2 is considered as a parasitic resistance. The value of the parasitic resistance is defined as RGND12, the voltage Vgs to be applied between the gate and the source of the NMOS of the second power system is calculated by:

$Vgs=(Vpower+RGND1*Iesd+RGND1D*Iesd+RGND12*Iesd+RGND2D*Iesd)-Vpmo$

As described with reference to FIG. 2, one aspect of the electrostatic destruction of the LSI chip is incurred by the ESD surge between the power pad and the ground pad in the mutually different power systems. Besides this aspect, the electrostatic destruction of the LSI chip may be incurred by emission of electric charges on the chip from the pad. A charged device model (CDM) test is a test concerning the electrostatic destruction of this type. The CDM test is a test for measuring the ESD tolerance of the LSI by means of short circuiting a measurement pin and an external GND in a state where electric charges are accumulated in the entire LSI chip.

Figure 3:
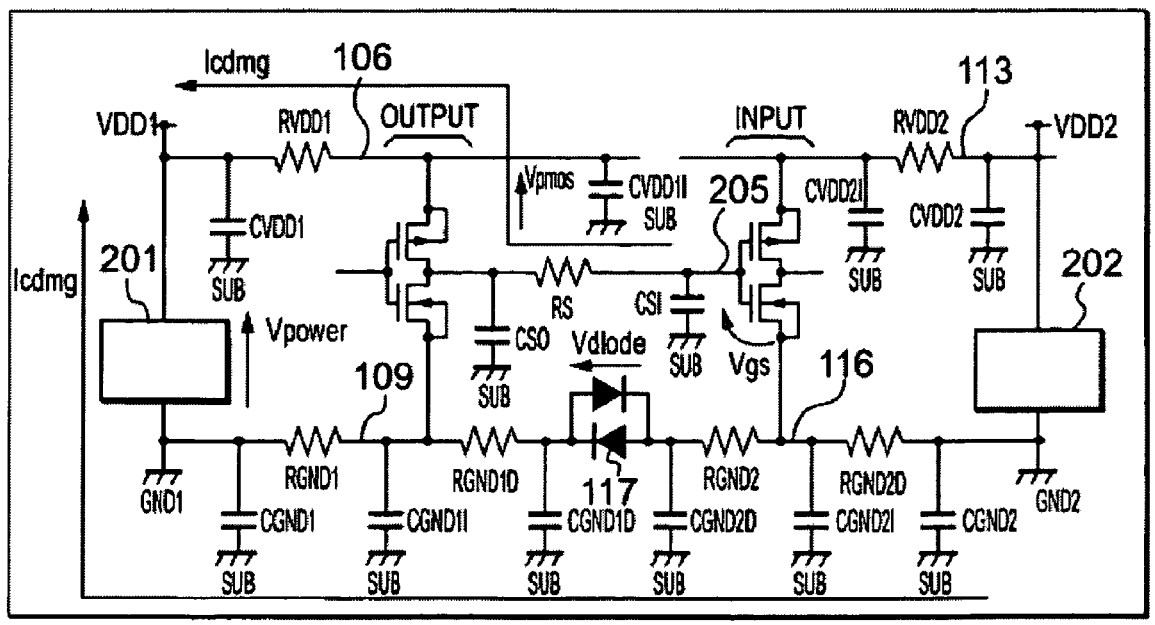
FIG. 3 also depicts the influence of the ESD surge current in the LSI device of the first embodiment.

Next, a discharging operation of the electric charges accumulated in the chip will be described with reference to FIG. 3. A circuit configuration shown in FIG. 3 is similar to the circuit in FIG. 2 except principal stray capacitors (CVDD1, CVDD1I, CVDD2I, CVDD2, CSO, CSI, CGND1, CGND1I, CGND1D, CGND2D, CGND2I, CGND2) which are additionally described therein, and the detailed description is therefore omitted.

Each of the principal stray capacitors is a stray capacitor provided between a substrate and any of the power supply wiring, the ground wiring, the signal wiring, and a diffusion layer. The electric charges accumulated in these stray capacitors are discharged from external connection pads. Description will be now made on a state inside the chip when the first power system power pad and the external GND are short circuited in the state where the electric charges are accumulated and then the electric charges accumulated inside the LSI chip are thereby discharged.

An electric current generated by movement of the electric charges accumulated in the first power system ground wiring 109 and the second power system ground wiring 116 is defined as Icdmg, an electric current generated by movement of the electric charged while being accumulated in the signal wiring 205 between the output inverter and the input inverter is defined as Icdms, and a resistance component of the first power system power supply wiring is defined as RVDD1. Upon the discharge, the voltage Vgs between the gate and the source of the NMOS of the input inverter 204 is calculated by:

$Vgs=(Vpower+RGND1*Icdmg+RGND1D*Icdmg+Vdiode+RGND2D*Icdmg)-(Rs*Icdms+Vpmos+-RVDD1*Icdms)$ When there is a large difference between the signal wiring resistance and the ground wiring resistance, or a large difference between the signal wiring resistance and the power supply wiring resistance, the voltage Vgs is increased by generation of a time difference between the electric currents Icdmg and Icdms and the gate oxide film is thereby destroyed. Since the power supply wiring resistance and the ground wiring resistance are normally small, it is important to reduce the signal wiring resistance RS in order to prevent the destruction of the gate oxide film by the CDM.

The circuit configuration of the LSI of this embodiment will be described in detail with reference to FIG. 1. In the LSI of this embodiment, the first power system input/output circuit 104 and the second power system input/output circuit 111 are placed closely to each other. It is more preferable that the first power system input/output circuit 104 and the second power system input/output circuit 111 are placed so as to contact each other at a boundary between the first power system circuit 101 and the second power system circuit 102. It is possible to reduce the ground wiring resistance by arranging the first power system input/output circuit 104 closely to the second power system input/output circuit 111.

With reference to FIG. 2, it is possible to reduce the ground wiring resistance values of RGND1D and RGND2D. Accordingly, it is possible to reduce the MOS gate potential attributable to the ESD surge and thereby to suppress the destruction of the gate oxide film. Otherwise, since it is possible to reduce the signal wiring resistance RS, it is therefore possible to suppress delay in electric current between the ground wiring and the signal wiring upon the discharge of the accumulated capacitance.

The delay between the input/output circuits in the first power system and the second power system is formed small in light of the ESD. The wiring delay can be realized by shortening a wiring length, increasing a wiring width, or reducing the wiring resistance. By suppressing the wiring delay, it is possible to suppress the destruction of the gate insulating film attributable to the time difference in the ESD discharge currents.

The first and second input/output circuit units 104 and 111 are respectively coupled to the relevant ground wiring in the vicinity of the protection element 117 between the sets of the ground wiring. In this way, it is possible to reduce the ground wiring resistance in the ESD surge current path. With reference to FIG. 2, it is possible to reduce the ground wiring resistance values of RGND1D and RGND2D.

The respective ground pads 108 and 115 in the first and second power system are coupled to the vicinity of the protection element 117 between the sets of the ground wiring. The ground pad 115 in the second power system is preferably coupled to the second power system ground wiring 116 at a node 118 located between the protection element 117 and a node 119 for the second power system input/output circuit and the second power system ground wiring. The ESD surge current path bypassing the input/output circuit unit is formed by connecting the ground pad more closely to the protection element than the input/output circuit unit, and it is possible to suppress an influence by the ESD surge to the input/output circuit unit (or the gate voltage Vgs inside the circuit unit). Similarly, the ground pad 108 in the first power system is coupled to the first power system ground wiring 109 at a node 120 located between the protection element 117 and a node 121 for the first power system input/output circuit and the first power system ground wiring.

As described above, according to this embodiment, when there are the plurality of power systems inside the LSI chip, it is possible to suppress the resistance values the resistors being parasitic on the power supply lines and thereby to prevent destruction of the elements inside the chip. Moreover, it is possible to prevent the ESD destruction of the elements inside the chip without depending on the circuit configuration of the inside of the LSI and thereby to obtain the high ESD tolerance stably.

Second Embodiment

Figure 4A:
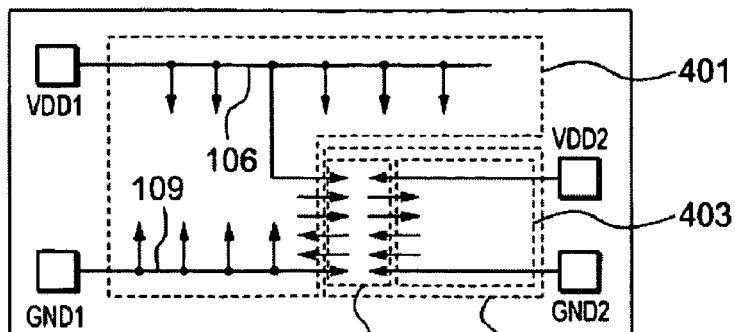
FIG. 4A depicts a circuit configuration of an LSI device according to a second embodiment of the present invention.

FIG. 4A is a circuit diagram showing a schematic configuration of an LSI according to a second embodiment of the present invention. The LSI of this embodiment includes a digital circuit as a first power system circuit, and an analog circuit as a second power system circuit. Part of the analog circuit is designed as an analog macro, and the analog macro contains a first power system input/output circuit to be operated by a first power supply.

In FIG. 4A, the LSI of this embodiment includes a digital circuit unit 401 and an analog macro 402. The analog macro 402 includes an analog internal circuit 403 and an input/output circuit unit 404.

Figure 4B:
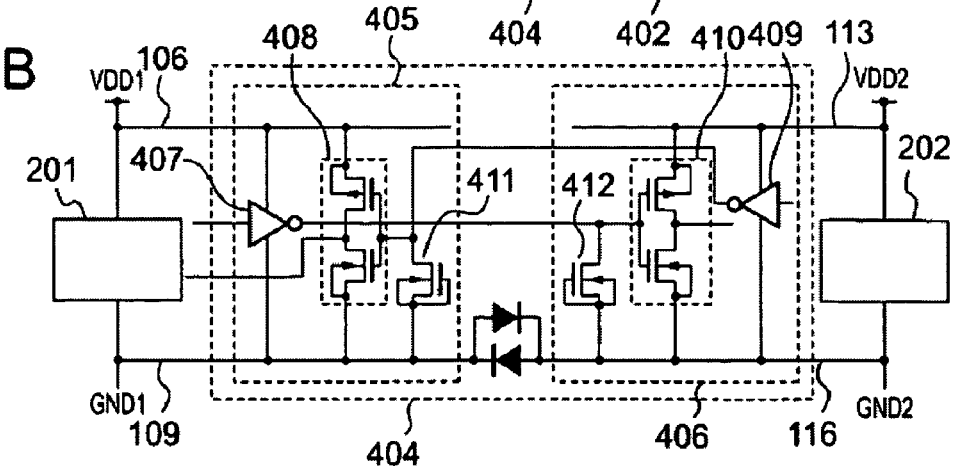
FIG. 4B depicts a circuit configuration of another LSI device according to the second embodiment of the present invention.

FIG. 4B is a circuit diagram showing a detailed configuration of the input/output circuit unit 404 of the analog macro. The input/output circuit unit 404 includes a first power system input/output circuit unit 405 and a second power system input/output circuit unit 406. In FIG. 4B, the input/output circuit unit 404 of the analog macro includes a first power system output inverter 407, a first power system input inverter 408, a second power system output inverter 409, a second power system input inverter 410, and a gate protection element 411.

The gate protection element 411 is formed of an NMOS transistor which is coupled to a gate for receiving an input signal of the first power system input inverter 408 and to the first power system ground wiring 109. When a high voltage is generated, the gate protection element 411 clamps electric potential between a gate and a source of the input inverter to clamp potential. Accordingly, it is possible to suppress destruction of a gate insulating film by maintaining the electric potential between the gate and the source of the input inverter within the clamp potential. Various widely known elements can be used as such a clamp element.

Similarly, a gate protection element 412 is coupled between a gate for receiving an input signal of the second power system input inverter 410 and the second power system ground wiring 116. The clamp element can be also coupled between the gate for receiving the input signal of the input inverter and the power supply wiring. For example, the clamp element is coupled between the gate for receiving the input signal of the second power system input inverter 410 and the second power system power supply wiring 113. An output of the first power system output inverter is coupled to the second power system input inverter with connection wiring, and an output of the second power system output inverter is coupled to the first power system input inverter with connection wiring.

By arranging the first power system input/output circuit unit and the second power system input/output unit inside the analog macro, it is possible to design a countermeasure for the ESD inside the analog macro. That is, ESD designing in LSI chip layout designing is facilitated and the ESD designing in digital circuit designing can be curtailed.

Moreover, by arranging the two input/output circuit units inside the analog macro, the first power system input/output circuit unit and the second power system input/output circuit unit are placed at a boundary between the first power system circuit unit and the second power system circuit unit so as to prevent the electrostatic destruction. In this way, it is easier to design placement in a vicinity region.

As described above, according to this embodiment, it is possible to prevent the ESD destruction inside the chip, to achieve a connection cell to realize the LSI having high ESD tolerance in a small area, and to perform automated designing when separating the power supply of the hard macro designed by another company with another power supply inside the chip.

Third Embodiment

Figure 5:
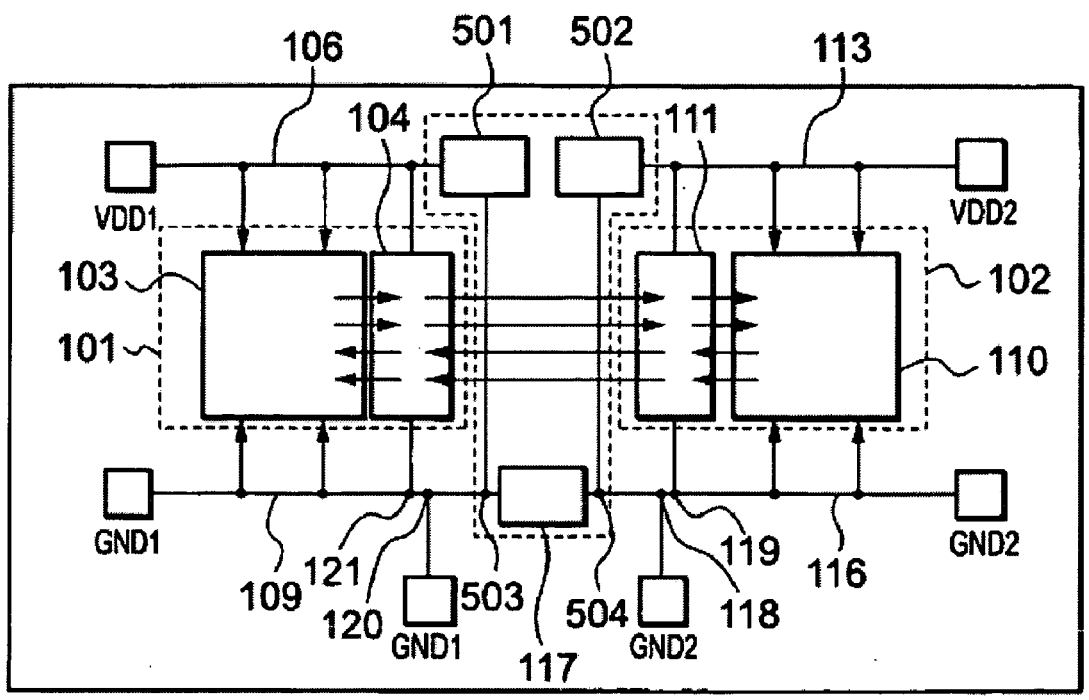
FIG. 5 depicts a circuit configuration of an LSI device according to a third embodiment of the present invention.

Next, a third embodiment according to the present invention will be described with reference to FIG. 5. FIG. 5 is a circuit diagram showing a schematic configuration of an LSI device of this embodiment. As described in FIG. 5, the LSI device of this embodiment includes a protection element 501 between VDD1 and GND1 which is coupled between the first power system power supply wiring 106 and the first power system ground wiring 109, and a protection element 502 between VDD2 and GND2 which is coupled between the second power system power supply wiring 113 and the second power system ground wiring 116.

In general, the power supply protection element clamps the electric potential between the power supply and the ground to the clamp potential upon application of the ESD if the potential difference between the power supply and the ground reaches or exceeds the clamp potential. Various widely known elements, such as a clamp element applying a transistor, can be used as the protection elements.

The protection element 501 between VDD1 and GND1 is coupled to the first power system ground wiring 109 at a node 503. The node 503 is placed in the vicinity of the protection element 117 between the sets of the ground wiring. In this way, it is possible to reduce the ground wiring resistance between the node and the protection element 117 so as to contribute to reduction in the ground wiring resistance of the ESD surge current.

Preferably, the node 503 is placed between the node 121 for the first power system input/output circuit unit and the first power system ground wiring, and, the protection element 117 between the sets of the ground wiring. By forming a bypass of the ESD current path with respect to the node of the input/output circuit, it is possible to suppress the influence to the input/output circuit by the ESD surge current.

Similarly, the protection element 502 between VDD2 and GND2 is coupled to the second power system ground wiring 116 at a node 504. The node 504 is placed in the vicinity of the protection element 117 between the sets of the ground wiring. Preferably, the node 504 is placed closer to the protection element 117 between the sets of the ground wiring than the node 119 for the second power system input/output circuit unit and the second power system ground wiring. The protection element 501 between VDD1 and GND1, the protection element 502 between VDD2 and GND2, and the protection element 117 between the sets of the ground wiring are formed within one cell. In this way, it is easy to perform the ESD designing by arranging one pre-designed cell at a boundary of the circuits to be operated by different power systems.

Fourth Embodiment

Figure 6:
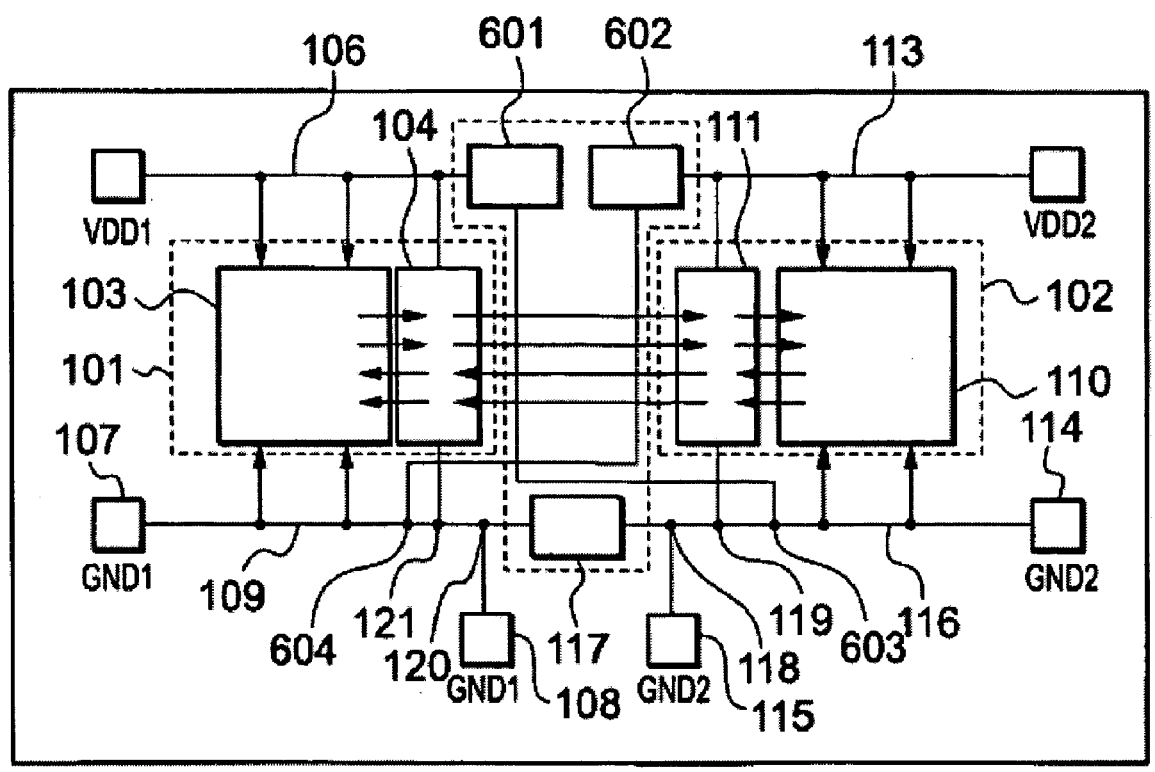
FIG. 6 depicts a circuit configuration of an LSI device according to a fourth embodiment of the present invention.

Next, a fourth embodiment according to the present invention will be described with reference to FIG. 6. FIG. 6 is a circuit diagram showing a schematic configuration of an LSI device of this embodiment. In the LSI device of this embodiment, the ESD protection elements are provided between the power supplies and the grounds in mutually different power systems. As described in FIG. 6, the LSI device according to the fourth embodiment of the present invention includes a protection element 601 between VDD1 and GND2 which is coupled between the first power system power supply wiring 106 and the second power system ground wiring 116, and a protection element 602 between VDD2 and GND1 which is coupled between the second power system power supply wiring 113 and the first power system ground wiring 109.

A node 603 for the protection element 601 between VDD1 and GND2 and the ground wiring 116 is coupled to a position farther than the node 119 for the second power system input/output circuit unit and the second power system ground wiring when viewed from the protection element 117 side. The node 603 is placed between the node 119 and the second power system ground pad 114. A node 604 for the protection element between VDD2 and GND1 and the ground wiring is coupled between the node 121 for the first power system input/output circuit unit and the first power system ground wiring, and the first power system ground pad 107.

Consideration is made on the ESD surge current path to be formed from the first power system power pad VDD1 to the second power system ground pad GND2 by coupling the first power system power supply wiring to the second power system ground wiring through the protection element. The node 603 for the protection element 601 between VDD1 and GND2 and the ground wiring 116 is placed closer to the ground pad 114 than the node 119 for the first power system input/output circuit unit and the first power system ground wiring. Accordingly, the ESD surge current path bypassing the node for the second power system input/output circuit unit and the ground wiring is formed, and the influence to the second power system input/output circuit unit by the ESD surge current can be thereby suppressed. Similarly, regarding connection between the second power system power supply wiring 113 and the first power system ground wiring 109 through the protection element 602 between VDD2 and GND1, it is possible to suppress the influence to the first power system input/output circuit unit concerning the ESD surge current path starting from the second power system power pad.

Each of the protection element 601 between VDD1 and GND2, the protection element 602 between VDD2 and GND1, and the protection element 117 between the sets of the ground wiring can be formed in one cell. It is easy to perform the ESD designing by arranging one pre-designed cell at a boundary of the circuits to be operated by different power systems.

Fifth Embodiment

Figure 7:
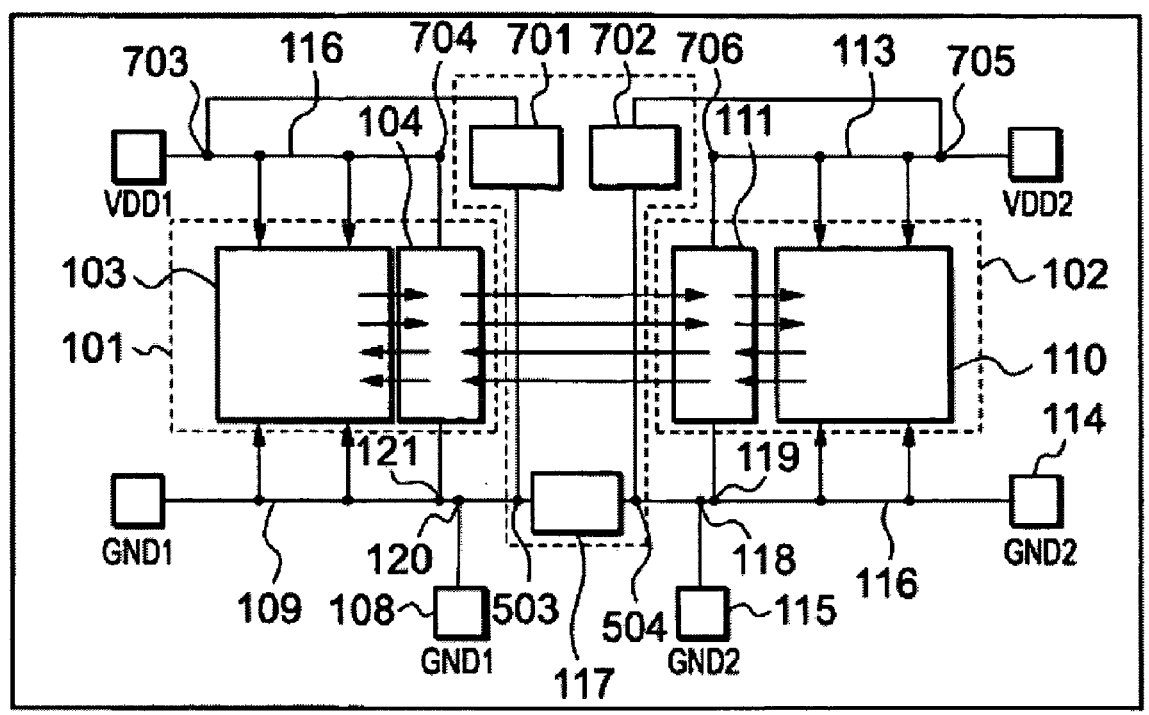
FIG. 7 depicts a circuit configuration of an LSI device according to a fifth embodiment of the present invention.

Next, a fifth embodiment according to the present invention will be described with reference to FIG. 7. FIG. 7 is a circuit diagram showing a schematic configuration of an LSI device of this embodiment. In the LSI device of this embodiment, the ESD protection elements are provided between the power supplies and the grounds mutually in the same power systems. As described in FIG. 7, the LSI device according to the fifth embodiment of the present invention includes a protection element 701 between VDD1 and GND1 which is coupled between the first power system power supply wiring 106 and the first power system ground wiring 109, and a protection element 702 between VDD2 and GND2 which is coupled between the second power system power supply wiring 113 and the second power system ground wiring 116. The elements to be used as the protection elements are similar to those used in the fourth embodiment.

A node 703 for the protection element 701 between VDD1 and GND1 and the first power system power supply wiring 106 is coupled between the first power system power pad 105 and a node 704 for the first power system input/output circuit 104 and the first power system power supply wiring 106. By coupling the protection element 701 between VDD1 and GND1 in a position closer to the first power system power pad than a node 704 for the first power system input/output circuit unit, it is possible to form the ESD surge current path bypassing the node for the first power system input/output circuit unit. The ESD surge current path starting from the first power system power pad passes through the protection element 701 between VDD1 and GND1 and flows to the first power system ground wiring 109.

Therefore, unlike the circuit described with reference to FIG. 5, the ESD surge current path flowing from the first power pad VDD1 to the first power system ground wiring through the protection element 701 between VDD1 and GND1 bypasses the node for the first power system input/output circuit. In this way, it is possible to suppress the influence to the first power system input/output circuit unit by the ESD surge current.

Regarding connection between the second power system power supply wiring and the second power system ground wiring as well, a node 705 for the protection element 702 between VDD2 and GND2 and the second power system power supply wiring 113 is coupled between the second power system power pad 112 and a node 706 for the second power system input/output circuit 111 and the second power system power supply wiring 113. In this way, the ESD surge current path bypassing the node for the second power system input/output circuit unit is formed. Accordingly, it is possible to suppress the influence to the second power system input/output circuit unit by the ESD surge current.

Concerning the protection element 601 between VDD1 and GND2 described in FIG. 6, it is also preferable that the node for the first power system power supply wiring is located closer to the power pad than the first power system input/output circuit unit. Concerning the protection element 602 between VDD2 and GND1 as well, it is preferable that the node for the second power system power supply wiring is located between the node for the second power system input/output circuit, and, the power pad. In this way, it is possible to form the ESD surge current path bypassing the node for the input/output circuit.

Variation of First to Fifth Embodiments

In the above first to fifth embodiments, ESD protection is described by using an SoC (System On Chip) in which a plurality of circuits to which power is supplied from different power supply systems in one chip as an example.

But, disclosure of the above first to fifth embodiments can be applied to ESD protection of System-in-package semiconductor device, which includes a plurality semiconductor chips mounted on one package. For example, the first power supply system circuit 101 can be fabricated on a first semiconductor chip, the second power supply system circuit 102 can be fabricated on a second semiconductor chip, the ESD protection element 117 can be fabricated on any of the first or second semiconductor chip, the first and second chips may be coupled with wiring, and LSI pads 105, 107, 108, 112, 114 may be replaced by external terminals.

Moreover, in the case of the above embodiments and SIP, the present invention can be applied to a circuit configuration in which the power supply wiring of the above embodiments is replaced with the ground wiring of the above embodiments.

Sixth Embodiment

In the case of the following embodiment, ESD protection of SIP (system-in-package type semiconductor device) in which a plurality of chips are mounted on one package is described. First, several modes of the SIP are described.

Figure 8:
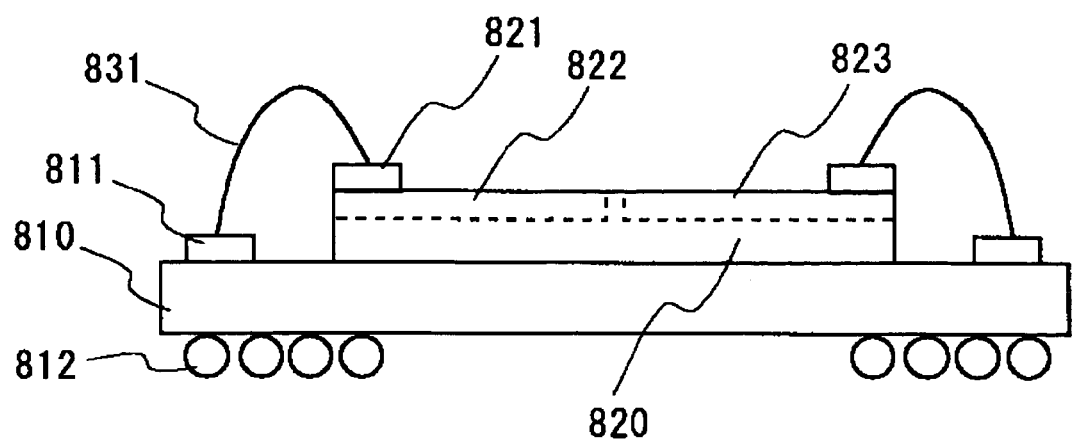
FIG. 8 depicts a configuration of the SoC according to first to fifth embodiments.

FIG. 8 depicts a conventional package configuration in which one chip is mounted on one package. As shown in FIG. 8, a chip 820 is mounted on an assembly substrate 810 and a bonding pad 821 formed on the chip 820 is connected with a bonding pad 811 on the assembly substrate 810 by a bonding wire 831. The chip 820 is an SoC in which a plurality of circuits 822 and 823 are constituted. A plurality of balls 812 for connection with the outside are arranged at the downside of the assembly substrate 810. An internal wiring for connecting the bonding pad 811 with the balls 812 each other is formed in the assembly substrate 810.

Figure 9:
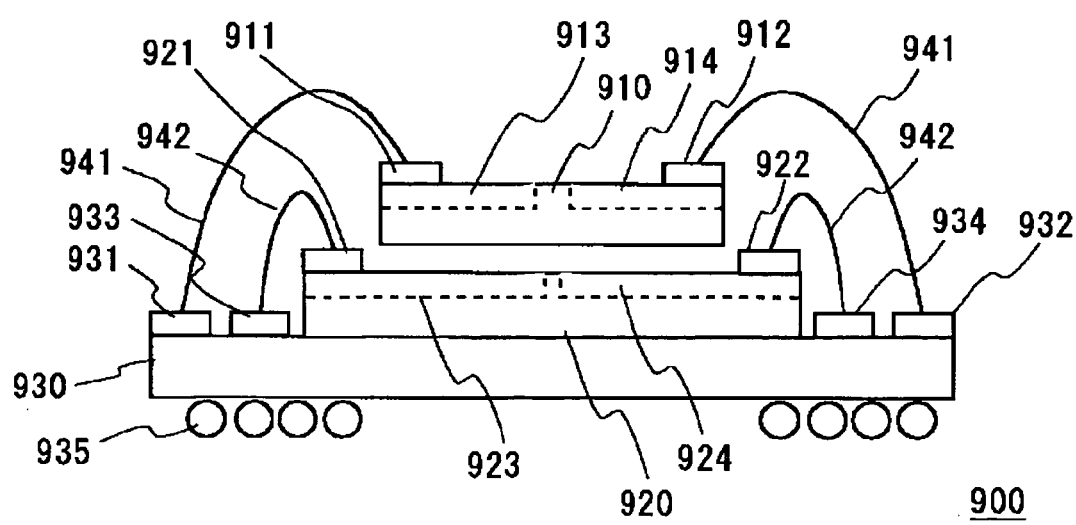
FIG. 9 depicts a configuration of system-in-package type semiconductor device according to a sixth embodiment.

Then, a configuration of the SIP is described below. The following is described by using a chip-on-chip structure in which a plurality of chips are laminated as an example, but the present invention can be also applied to SIP in which a plurality of chips are arranged like a plane. FIG. 9 is a side view showing a configuration of SIP. SIP 900 has a first chip 910, second chip 920, and assembly substrate 930. In FIG. 9, the first chip 910 is laminated on the second chip 920 and moreover, these are arranged on the assembly substrate 930. These are integrated so that circuit forming faces of the first chip 910 and second chip 920 are in the same direction (opposite to substrate).

The first chip 910 has bonding pads 911 and 912 on the surface and is connected by the bonding pads 931 and 932 and a bonding wire 941 of the assembly substrate 930. The first chip 910 has a circuit units 913 and 914. The circuit units 913 and 914 are connected to the assembly substrate 930 through the bonding pads 911 and 912.

Moreover, the second chip 920 has bonding pads 921 and 922 on the surface and is connected by bonding pads 933 and 934 and bonding wire 942 of the assembly substrate 930. The second chip 910 has a circuit units 923 and 924. The circuit units 923 and 924 are connected to the assembly substrate 930 through the bonding pads 921 and 922.

The first chip 910 and second chip 920 are individually connected to the assembly substrate 930 and the first chip 910 and second chip 920 are connected through an internal wring of the assembly substrate 930. A plurality of balls 935 are formed at the downside of the assembly substrate 930 and used for connection with an external circuit.

Figure 10:
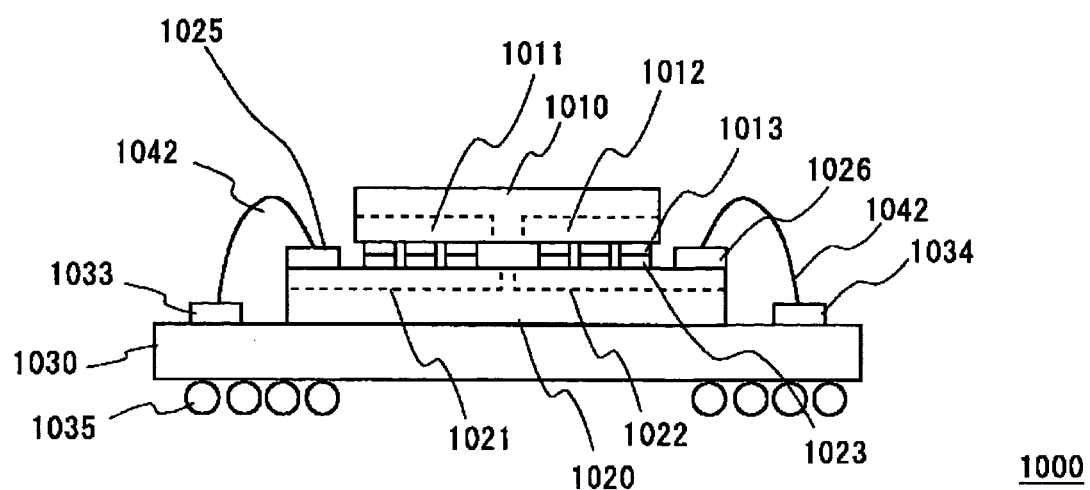
FIG. 10 depicts a configuration of another system-in-package type semiconductor device according to the sixth embodiment.

FIG. 10 is a side view showing another configuration of SIP. SIP 1000 has a first chip 1010, second chip 1020, and assembly substrate 1030. In FIG. 10, the first chip 1010 is laminated on the second chip 1020 and moreover, these are arranged on the assembly substrate 1030. The first chip 1010 and second chip 1020 are laminated so that circuit forming faces of the chips are faced each other.

The first chip 1010 has circuit units 1011 and 1012 at the side facing the second chip 1020. Moreover, the first chip 1010 has a connection pad 1013 on the surface facing the second chip 1020. Similarly, the second chip 1020 has circuit units 1021 and 1022 at the side facing the first chip 1010. Furthermore, the second unit 1020 has a connection pad 1023 on the surface facing the first chip 1010. The circuit of the first chip 1010 is connected with the circuit of the second chip 1020 through these connection pads 1013 and 1023.

The second chip 1020 has bonding pads 1025 and 1026 on the surface and is connected by bonding pads 1033 and 1034 and bonding wire 1042 of an assembly substrate 1030. The circuit units 1021 and 1022 are connected to the assembly substrate 1030 through the bonding pads 1033 and 1034. A plurality of balls 1035 are formed at the downside of the assembly substrate 1030 and used for connection with an external circuit. An internal wiring is formed in the assembly substrate 1030 to connect the bonding pads 1033 and 1034 and balls 1035.

In the case of the example in FIG. 10, the first chip 1010 is not directly connected with the assembly substrate 1030 but it is connected with the assembly substrate 1030 through the second chip 1020.

It is possible to form a circuit configuration in which the first chip 1010 has a bonding pad and power supply and GND are supplied from the assembly substrate 1030.

The circuit configuration relating to ESD protection described for the above first to fifth embodiments can be applied to each SIP described above. For example, it is possible to form circuit units belonging to different power supply systems described for the first to fifth embodiments in separate chips. Input/output of signals in the first power supply system and second power supply system is executed through an inter-chip connection wiring. The inter-chip connection wiring is constituted of a wiring in an assembly substrate or connection pad for directly connecting chips.

In this case, the influence of the ESD surge current (Iesd) described by referring to FIG. 2 is described on an example of SIP. It is assumed the circuit of the first power supply system in FIG. 2 is formed on a first chip and the circuit of the second power supply system is formed on a second chip. A protection circuit 117 using a diode in FIG. 2 is replaced by a parasitic resistance component (RGND12) of an inter-chip wiring. Then, when ESD surge is applied between a first power-supply-system power supply pad 105 and a second power-supply-system ground pad 114, a voltage Vgs applied between the gate and the source of an NMOS of a second power-supply-system input inverter is shown by the following expression.

$$Vgs = (Vpower + RGND1*Iesd + RGND1D*Iesd + RGND12*Iesd + RGN2D*Iesd) - Vpmos$$

When a voltage immediately before breakdown of a gate oxide film is assumed as Vgsmax, a condition in which the gate oxide film is not broken down is shown by the following expression.

$$RGND12 < (Vgsmax + Vpmos - Vpower)/Iesd - RGND1 - RGND1D - RGN2D$$

The discharge action of chip accumulated electric charges described by referring to FIG. 3 is similarly described on an example of SIP. The protection circuit 117 is replaced by the parasitic resistance component (RGND12) of an inter-chip connection wiring. The voltage Vgs between the gate and the source of the NMOS of an input inverter 204 is shown by the following expression.

$$Vsg = (Vpower + RGND1*Icdmg + RGND1D*Icdmg + RGND12*Icdmg + RGND2D*Icdmg) - (Rs*Icdms + Vpmos + RVDD1*Icdms)$$

A condition in which a gate oxide film is not broken down is shown by the following expression.

$$RGND12 < (Vgsmax + Vpmos - Vpower)/Icdmg - (RGND1 + RGND1D + RGND2D) + (Rs + RVDD1)*Icdms/Icdmg$$

Seventh Embodiment

Figure 11:
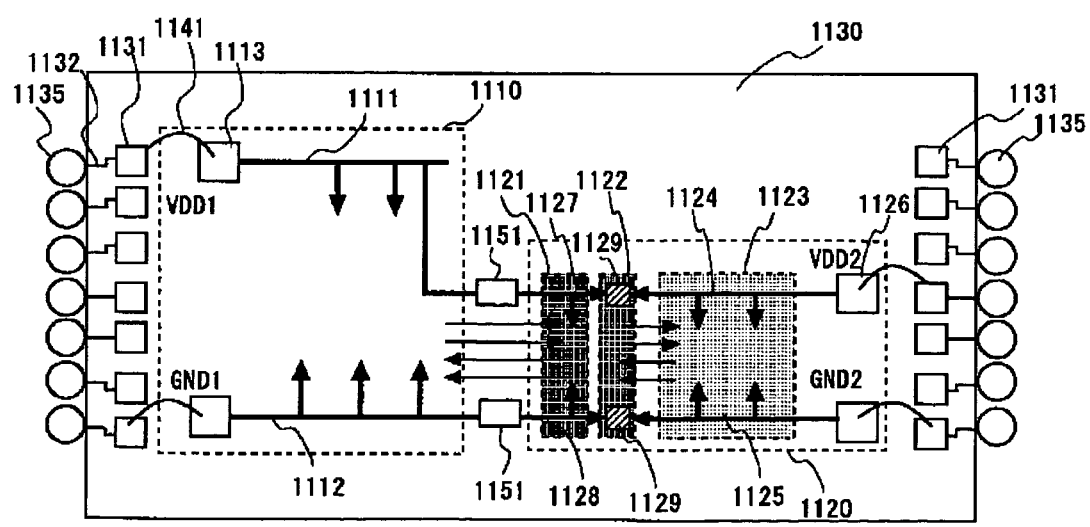
FIG. 11 depicts a circuit configuration of a system-in-package type semiconductor device of a seventh embodiment.

FIG. 11 is a block diagram for explaining the outline of a circuit configuration of the semiconductor integrated device of this embodiment. FIG. 11 shows a circuit configuration to be applied to the SIP shown in FIG. 9 by developing the circuit configuration into a top view. In FIG. 11, reference numeral 1110 denotes a first chip, 1120 denotes a second chip, and 1130 denotes an assembly substrate on which the first and second chips are mounted. The first chip 1110 has a first-chip power supply wiring 1111 for supplying a power supply potential and a first-chip ground wiring 1112 for supplying a ground potential. Power is supplied to the circuit unit of the first chip between the first-chip power supply wiring 1111 and the first-chip ground wiring 1112. Though not illustrated, the circuit unit of the first chip includes an input/output circuit unit serving as an interface for performing input and/or output of a signal with an input/output circuit unit of the second chip 1120 and an internal circuit unit serving as a main circuit.

Each of the first-chip power supply wiring 1111 and first-chip ground wiring 1112 is connected to an external circuit through a first-chip bonding pad 1113 and the assembly substrate 1130. Specifically, the bonding pad 1113 of the first chip 1110 is connected to a bonding pad 1131 of the assembly substrate by a bonding wire 1141 and moreover, the bonding pad 1131 of the assembly substrate is connected to a ball 1135 connected with an external circuit through an internal wiring 1132 of the assembly substrate.

The second chip 1120 has an input/output circuit unit 1121 for performing input and/or output of a signal with an input/output circuit unit of the first chip 1110 and an internal circuit unit 1123 serving as a main circuit unit for performing input and/or output of a signal through a level shifter 1122. The power consumption of the internal circuit unit 1123 serving as the main circuit unit is relatively larger than that of the input/output circuit unit 1121. Power is supplied to the internal circuit unit 1123 from a second chip first power supply wiring 1124 and a second-chip first ground wiring 1125. Therefore, the internal circuit unit 1123 of the second chip is different from the circuit unit of the first chip in power supply system. The second-chip first power supply wiring 1124 and second-chip first ground wiring 1125 are connected to the assembly substrate 1130 through the bonding pad 1126 of the second chip. It is possible to supply a potential to the second-chip first power supply wiring 1124 and second-chip first ground wiring 1125 from the outside through the ball 1135 and bonding pad 1131 of the assembly substrate similarly to the case of the first-chip power supply wiring 1111 and the first chip ground wiring 1112.

Power and ground potential are supplied to the input/output circuit unit 1121 from the first chip 1110. A first power supply wiring and first ground wiring are connected to an input/output-circuit-unit power supply wiring 1127 and input/output-circuit-unit ground wiring 1128 through an inter-chip connection wiring (including terminals of wiring and pad). Though a parasitic resistance component 1151 is present in the inter-chip wiring, the first-chip power supply wiring 1111 and input/output-circuit-unit power supply wiring 1127 and the first chip ground wiring 1112 and input/output-circuit-unit ground wiring 1128 are connected each other without through a protection device respectively.

Therefore, power and ground potential are the same between (the input/output circuit unit of) the first chip 1110 and the input/output circuit unit 1121 and a power supply system is common between them. It is preferable to form an input/output circuit unit to be operated by a pulled-in power supply wiring (power supply and ground wiring) into a chip having a relatively-many power supply systems or relatively-low junction breakdown voltage.

Because an area for a protection circuit is small in these chips, it is possible to make a general circuit configuration efficient.

The input/output-circuit-unit power supply wiring 1127 and second-chip first power supply wiring 1124 are connected to the level shifter 1122 and these wrings are connected each other through a protection circuit 1129. Moreover, the input/output-circuit-unit ground wiring 1128 and second-chip first ground wiring 1125 are connected to the level shifter 1122 and these wirings are connected each other through the protection circuit 1129. It is possible to set the potential values of the first chip 1110 and second chip 1120 to an equal value or different values.

In the case of this embodiment, different power supply systems are constituted in the internal circuit unit of the first chip 1110 and that of the second chip 1120. Moreover, signals are delivered between circuits (internal circuit and input/output circuit units) of the first chip 1110 and the input/output circuit unit 1121 of the second chip, these circuit units are included in a common power supply system, and the power supply and ground potential are the same. As shown in FIG. 11, the power supply and ground of a circuit of the first chip 1110 for delivering a signal with the input/output circuit unit 1121 are pulled into the second chip 1120 and pulled-in power and ground are supplied to the input/output circuit unit 1121. In the case of ESD discharge between chips, ESD current mainly flows through commonized power supply wiring and ground wiring (power supply wiring). Therefore, it is possible to decrease a potential difference between input/output circuits between chips. Therefore, it is possible to prevent a transistor of an input/output circuit unit for delivering signals between chips from being broken down or decrease the number of ESD protection circuits for preventing the transistor from being broken down.

Eighth Embodiment

Figure 12:
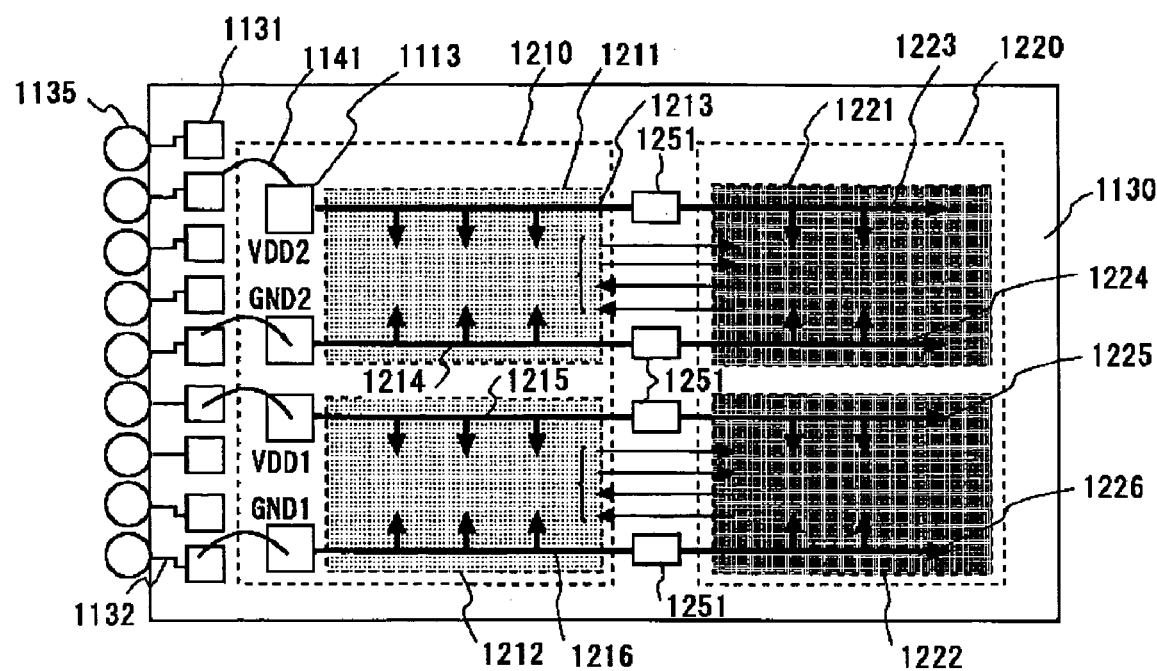
FIG. 12 depicts a circuit configuration of a system-in-package type semiconductor device according to an eighth embodiment.

FIG. 12 is a block diagram for explaining the outline of a circuit configuration of a semiconductor integrated circuit device of this embodiment. FIG. 12 develops a circuit configuration to be applied to the SIP shown in FIG. 10 into a top view. Power and ground potential are supplied to the second chip through a wiring in the first chip. As shown in FIG. 12, the first chip 1210 has a first circuit unit 1211 and a second circuit unit 1212. The first circuit unit 1211 and second circuit unit 1212 are included in different power supply systems. Potential values of the units 1211 and 1212 can be the same or different. Power is supplied to the first circuit unit 1211 from first power supply wiring 1213 and first ground wiring 1214 of the first chip. Power is supplied to the second circuit unit 1212 of the first chip from a second power supply wiring 1215 and second ground wiring 1216 of the first chip. The first and second power supply wirings 1213 and 1215 and first and second ground wirings 1214 and 1216 are connected with the outside through the bonding pad 1113.

The second chip 1220 has a first circuit unit 1221 and a second circuit unit 1222. The first circuit unit 1121 of the second chip delivers signals with the first circuit unit 1211 of the first chip and the second circuit unit 1222 of the second chip delivers signals with the second circuit unit 1212 of the second chip. Moreover, the power and ground of the first circuit unit 1211 of the first chip are pulled into the first circuit unit 1221 of the second chip and the same power and ground potential are supplied to the first circuit units 1221 and 1211. Similarly, power and ground of the second circuit unit 1212 of the first chip are pulled into the second circuit unit 1222 of the second chip and the same power and ground potential are supplied to the second circuit unit 1222 of the second chip and the second circuit unit 1212 of the first chip.

Specifically, a power supply wiring 1223 for supplying power to the first power supply wiring 1213 of the first chip and the first circuit unit of the second chip are connected each other through an inter-chip connection wiring (including terminals of wiring and pad). Though a parasitic resistance component 1251 is present in the inter-chip wiring, the power supply wirings 1213 and 1223 are connected each other without through a protection device. Similarly, the first ground wiring 1214 of the first chip and the ground wiring 1224 for supplying power to the first circuit unit of the second chip are connected each other without through a protection device. Thus, power and ground potential are supplied to the first circuit unit 1221 of the second chip through the power supply wiring and ground wiring of the first circuit unit 1211 of the first chip.

The power supplies and ground systems of the second circuit unit 1212 of the first chip and the second circuit unit 1222 of the second chip have the same configurations as the configurations of the first and second circuit units 1211 and 1221 of the first and second chips. Power supply wrings 1215 and 1225 of the second circuit unit and ground wirings 1216 and 1226 are connected by an inter-chip wiring not trough a protection device between the first chip 1210 and the second chip 1220.

Thus, when the first chip 1210 and second chip 1220 have circuit units (first circuit units 1211 and 1221 and second circuit units 1212 and 1222) having different power supply systems, a power supply system is common between circuit units (between first circuit units 1211 and 1221 and between second circuit units 1212 and 1222) for delivering a signal between the first and second chips. Because ESD current mainly flows through a commonized power supply wiring and ground wiring (power supply wiring) in the ESD discharge between chips, it is possible to prevent a transistor of a circuit unit for delivering signals between chips from being broken down or reduce the number of ESD protection circuits for preventing the transistor from being broken down.

Ninth Embodiment

Figure 13:
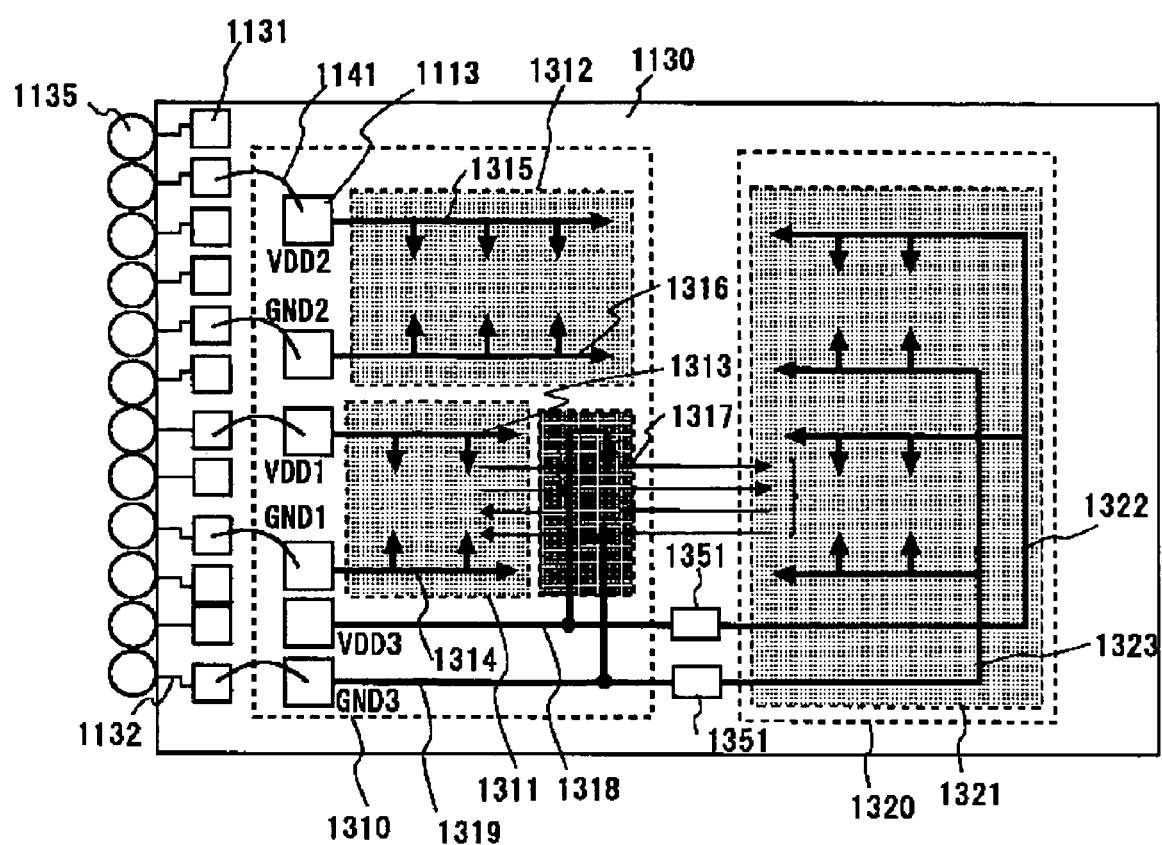
FIG. 13 depicts a circuit configuration of a system-in-package type semiconductor device according to a ninth embodiment.

FIG. 13 is a block diagram for explaining the outline of a circuit configuration of the semiconductor integrated circuit device of this embodiment. FIG. 13 develops a circuit configuration to be applied to the SIP shown in FIG. 10 into a top view. A first chip 1310 has a first internal circuit unit 1311 which is one of main circuits and a second internal circuit unit 1312 which is one of the main circuits. The first internal circuit unit 1311 and second internal circuit unit 1312 are included in different power supply systems. Potential values of the systems can be the same or different.

Power is supplied to the first internal circuit unit 1311 from a first power supply wiring 1313 and first ground wiring 1314. Power is supplied to the second internal circuit unit 1312 from a second power supply wiring 1315 and second ground wiring 1316. First and second power supply wirings 1313 and 1315 and first and second ground wirings 1314 and 1316 are connected with the outside through a bonding pad 1131.

The first chip 1310 further includes an input/output circuit unit 1317 functioning as an interface circuit of signals between the first internal circuit unit 1311 and the circuit unit of the second chip. The input/output circuit unit 1317 is included in a power supply system different from power supply systems of the first internal circuit unit 1311 and second internal circuit unit 1312 and power supply potential and ground potential are supplied to the input/output circuit unit 1317 from a third power supply wiring 1318 and third ground wiring 1319. The third power supply wiring 1318 and ground wiring 1319 are connected with an external circuit through the bonding pad 1113. The third power supply wiring 1318 and third ground wiring 1319 are connected to each other through the second chip 1320 and an inter-chip connection wiring. In FIG. 13, a level shifter between the first internal circuit unit 1311 and input/output circuit unit 1317 is omitted.

The second chip 1320 has a circuit unit 1321. Though not illustrated, the circuit unit 1321 has an input/output circuit unit and an internal circuit unit serving as a main circuit unit. (The input/output circuit unit of) the circuit unit 1321 delivers signals with the input/output circuit unit 1317 of the first chip. Power is supplied to the circuit unit 1321 through the third power supply wiring 1318 and third ground wiring 1319 of the first chip. A power supply wiring 1322 and ground wiring 1323 are formed on the second chip 1320 and they are connected with the third power supply wiring 1318 and third ground wiring 1319 by an inter-chip connection wiring. Though the inter-chip connection wiring includes a parasitic resistance component 1351, the power supply wiring 1322 and ground wiring 1323 of the second chip are connected with the third power supply wiring 1318 and third ground wiring 1319 without through a protection circuit. Thereby, the input/output circuit unit 1317 of the first chip and the circuit unit 1321 of the second chip 1320 are commonized in power supply system.

As described above, the first circuit unit 1311 of the first chip and the circuit unit 1321 of the second chip are included in different power supply systems and input/output of signals is performed between these circuits. The input/output circuit unit 1317 serving as an interface of signals between the above circuits is formed on the first chip 1310. The input/output circuit unit 1317 of the first chip and the circuit unit 1321 (including input/output circuit unit and internal circuit unit) of the second chip are included in the same power supply system and power is supplied to the circuit unit 1321 of the second chip through the third power supply wiring and the ground wirings 1318 and 1319 for supplying power and ground potential to the input/output circuit unit 1317. In the case of the ESD discharge between chips, ESD current mainly flows through the power supply wirings (1322 and 1318) serving as commonized power supply wirings and the ground wirings (1323 and 1319). Therefore, it is possible to prevent a transistor of an input/output circuit for delivering signals between chips from being broken down or decrease the number of ESD protection circuits for preventing the transistor from being broken down.

Tenth Embodiment

Figure 14:
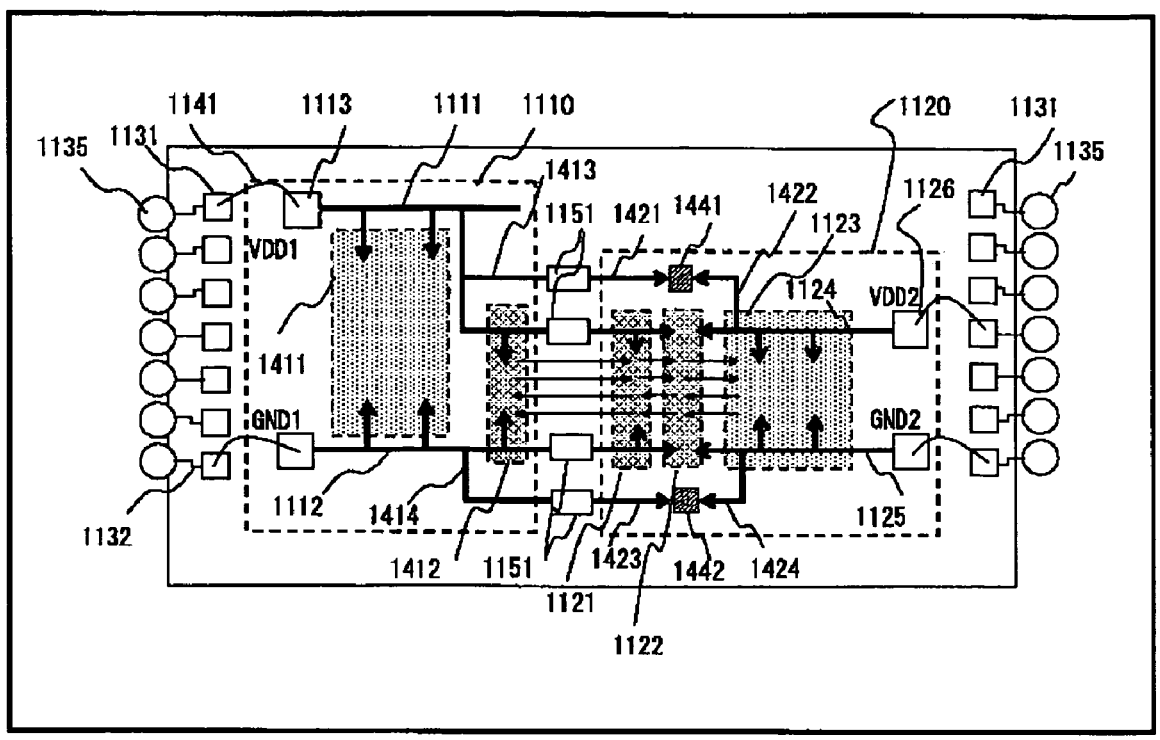
FIG. 14 depicts a circuit configuration of a system-in-package type semiconductor device according to a tenth embodiment.

FIG. 14 is a block diagram for explaining the outline of a circuit configuration of a semiconductor integrated circuit device of this embodiment. FIG. 14 includes a power-supply-wiring and ground-wiring routes formed by bypassing the input/output circuit units of the first and second chips between chips in addition to the circuit configuration shown in FIG. 11. Connection through the protection circuit 1129 in FIG. 11 is not made in this embodiment.

In FIG. 14, a first chip 1110 has an internal circuit unit 1411 and an input/output circuit unit 1412 for performing input and/or output of signals with the second chip 1120. The power supply and ground of the internal circuit unit 1411 are commonized with those of the input/output circuit unit 1412 and these circuit units are supplied with power between the power supply wiring 1111 and the ground wiring 1112.

The input/output circuit unit 1121 of the second chip performs input and/or output of signals with the input/output circuit unit 1412 of the first chip. The power supply and ground of the input/output circuit unit 1121 of the second chip are commonized with those of the input/output circuit unit 1412 of the first chip and these are included in a common power supply system. As shown in FIG. 14, the power supply wiring 1111 of the first chip is branched and one wiring route supplies a power supply potential to the input/output circuit unit 1412 of the first chip and the input/output circuit unit 1121 of the second chip. Other wiring route is connected to the power supply wiring 1124 of the internal circuit unit 1123 of the second chip 1120 through an inter-chip wiring and a protection circuit 1441 as an ESD discharge route.

A power supply wiring 1413 branched from the power supply wiring 1111 of the first chip bypasses the input/output circuit unit 1412 of the first chip but it is not connected to the unit 1412 or it does not supply a power supply potential to the input/output circuit unit 1412. The branched power supply wiring 1413 is connected to the wiring 1421 of the second chip through an inter-chip connection wiring. The wiring 1421 of the second chip is connected to the power supply wiring 1124 of the internal circuit 1123 of the second chip by the wiring 1422 through the protection circuit 1441. A route specified by the wirings 1421 and 1422 of the second chip is formed by bypassing the input/output circuit unit 1121 without supplying power to the input/output circuit unit 1121 of the second chip.

The same is also applied to a ground wiring. A ground wiring 1112 of the first chip is branched and one wiring route supplies a ground potential to the input/output circuit unit 1412 of the first chip and the input/output circuit unit 1121 of the second chip and the other wiring route is connected to the ground wiring of the internal circuit 1123 of the second chip through an inter-chip wiring and protection circuit 1442 as an ESD discharge route. A ground wiring 1414 branched from the ground wiring 1112 bypasses the input/output circuit unit 1412 of the first chip but it is not connected to the unit 1412 or it does not supply power to the input/output circuit unit 1412.

The branched ground wiring 1414 of the first chip is connected to a wiring 1423 of the second chip through an inter-chip connection wiring. The wiring 1423 of the second chip is connected to a ground wiring 1125 of the internal circuit 1123 of the second chip through the protection circuit 1442 and a wiring 1424. Thus, in the case of the second chip 1120, the wiring 1125 for supplying power to the internal circuit 1123 is branched and a wiring route for ESD discharge is formed. The wirings 1423 and 1424 for constituting the wiring route bypass the input/output circuit unit 1121 of the second chip but it is not connected to the unit 1121 or it does not supply power to the input/output circuit unit 1121.

In the case of this embodiment, a route for ESD discharge which is not connected to the input/output circuit unit 1412 or 1121 but it bypasses the unit is formed between the power supply wiring 1124 of the internal circuit unit of the second chip and the power supply wiring 1111 of the internal circuit unit of the first chip. Similarly, a route for ESD discharge which is not connected to the input/output circuit unit 1412 or 1121 but it bypasses the units 1412 and 1121 is formed between the ground wiring 1125 of the internal circuit unit of the second chip and the ground wiring 1112 of the internal circuit unit of the first chip. Because ESD current flowing between an external connection terminal (bonding pad) and a chip mainly flows through the route for ESD discharge, it is possible to prevent a transistor of an interface circuit for delivering signals between chips from being broken down or decrease the number of ESD protection circuits for preventing a transistor from being broken down. In the case of this embodiment, the power supply system of the internal circuit unit 1123 of the second chip is different from that of the internal circuit unit 1411 of the first chip. It is possible to apply the present invention to a circuit configuration in which the power supply systems are commonized.

Eleventh Embodiment

Figure 15:
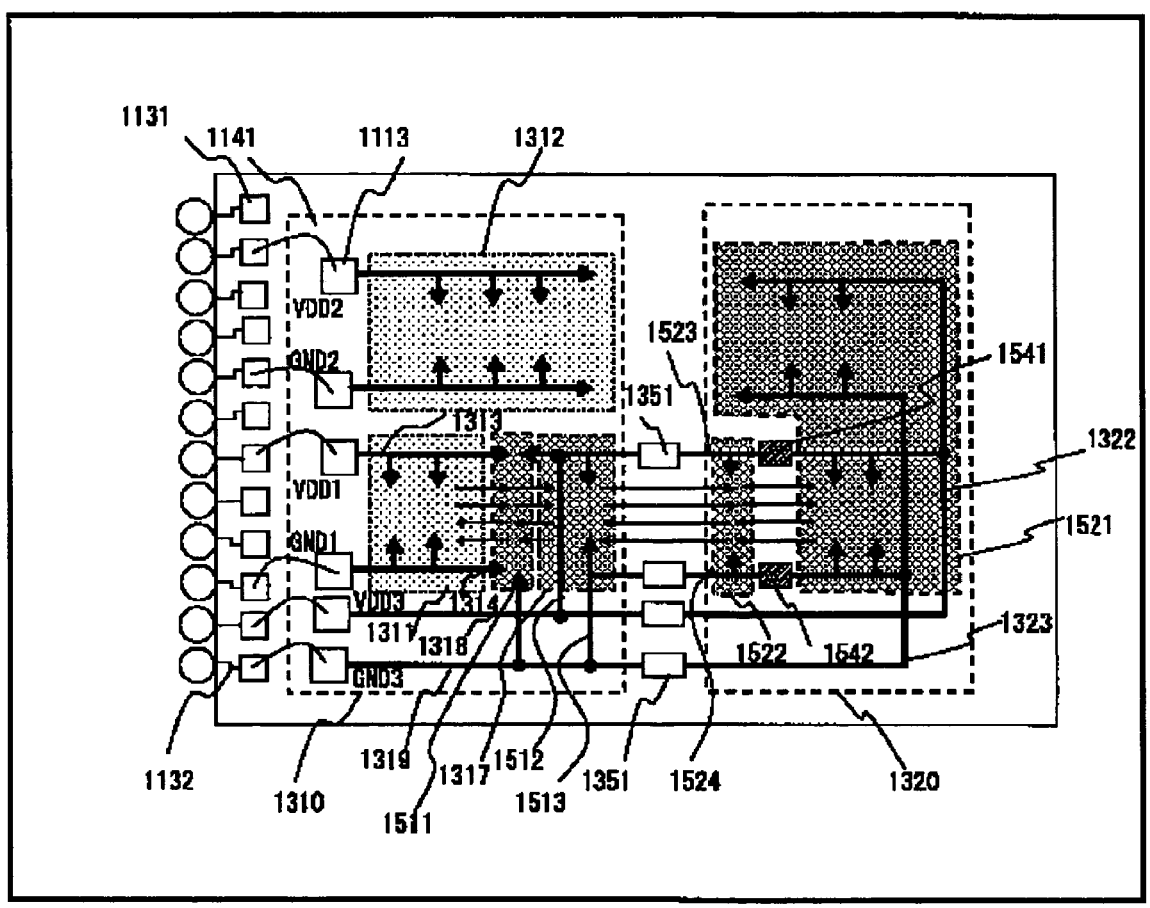
FIG. 15 depicts a circuit configuration of a system-in-package type semiconductor device according to an eleventh embodiment.

FIG. 15 is a block diagram for explaining the outline of a circuit configuration of a semiconductor integrated circuit device of this embodiment. FIG. 15 shows an illustration in which a wiring route for directly connecting power supplies and ground wirings of the input/output circuit units of the first chip and second chip through inter-chip connection is formed in addition to the circuit configuration shown in FIG. 13. In FIG. 15, reference numeral 1511 denotes a level shifter between the internal circuit unit 1311 and an input/output circuit unit in the first chip 1310. The second chip has an internal circuit 1521 and an input/output circuit unit 1522 for performing input and/or output of signals with the first chip. The input/output circuit unit 1522 of the second chip performs input and/or output of signals with an input/output circuit unit 1317 of the first chip.

A third power supply wiring 1318 of the first chip is branched and one wiring route supplies a power supply potential to the intern circuit unit 1521 of the second chip and the other wiring route supplies a power supply potential to the input/output circuit unit 1317 of the first chip and the input/output circuit unit 1522 of the second chip. Specifically, the third power supply wiring 1318 is branched in the first chip and one power supply wiring 1512 is connected to the input/output circuit unit 1317 of the first chip to supply power. Moreover, the power supply wiring 1512 is connected to a power supply wiring 1523 for supplying power to the input/output circuit unit 1522 of the second chip through an inter-chip connection wiring. The power supply wirings 1512 and 1523 are connected without through a protection circuit and their power supply systems are commonized.

One wiring route of the third power supply wiring 1318 is connected to a power supply wiring 1322 for supplying power to the internal circuit unit of the second chip through an inter-chip connection wiring. In the second chip 1320, the power supply wiring 1322 of the internal circuit unit of the second chip and the power supply wiring 1523 of the input/output circuit unit 1522 are connected through a protection circuit 1541.

A ground wiring also has the same configuration as the above power supply wiring. A third ground wiring 1319 of the first chip is branched and one wiring route supplies power to the internal circuit unit 1521 of the second chip and the other wiring route supplies power to the input/output circuit unit 1317 of the first chip and the input/output circuit unit 1522 of the second chip. Specifically, the third ground wiring 1319 is branched in the first chip 1310 and one ground wring 1513 is connected to the input/output circuit unit 1317 of the first chip to supply a ground potential. Moreover, the ground wiring 1513 of the input/output circuit unit 1317 of the first chip is connected to a ground wiring 1524 for supplying a ground potential to the input/output circuit unit 1522 of the second chip through an inter-chip connection wiring. The ground wirings 1513 and 1524 are connected without through a protection circuit and power supply systems are commonized.

Another wiring route of the third ground wiring 1319 is connected to a ground wiring 1323 for supplying power to the internal circuit unit 1521 of the second chip through an inter-chip connection wiring. In the second chip, the ground wiring 1323 of the internal circuit unit is connected with the ground wiring 1524 of the input/output circuit unit 1522 though a protection circuit 1542.

As described above, a power-supply wiring route and ground wiring route for supplying power to the input/output circuit unit of the second chip are formed separately from the power supply wiring and ground wiring for supplying power to the internal circuit unit 1521 serving as a main circuit unit of the second chip. Wiring routes for connecting the power supply wirings 1318 and 1319 of the first chip with the power supply wirings 1322 and 1323 of the internal circuit unit 1521 of the second chip are formed so as to bypass input/output circuit units of the first and second chips without being connected to the input/output circuit units of the first and second chips. Thereby, CDM discharge current from the internal circuit unit 1521 of the second chip is discharged mainly through the wiring route. However, because the stray capacitances of the power supply wiring and ground wiring of the input/output circuit unit 1522 of the second chip are smaller than the stray capacitances of the power supply wiring and ground wiring of the internal circuit unit 1521 of the second chip, the CDM discharge current between the input/output circuit units decreases and it is possible to prevent a transistor of a circuit for delivering signals between chips from being broken down or decrease the number of ESD protection circuits. In the case of the above example, the internal circuit unit 1311 of the first chip and the internal circuit unit 1521 of the second chip belong to different power supply systems. The present invention can be applied to a circuit configuration in which the power supply systems of these circuits are commonized.

Twelfth Embodiment

Figure 16:
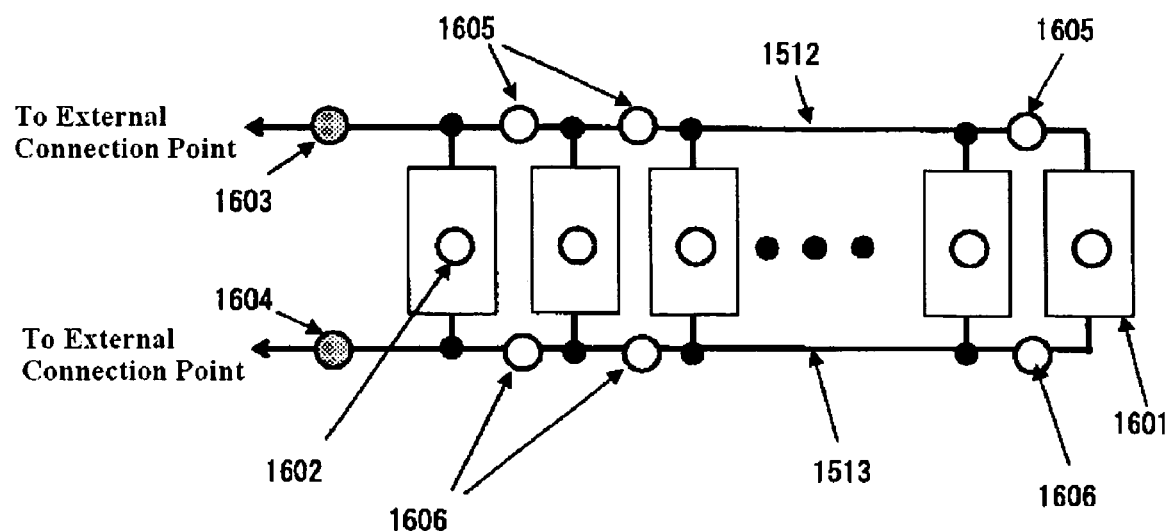
FIG. 16 depicts a circuit configuration nearby an input/output circuit unit according to a twelfth embodiment.

FIG. 16 shows a preferable circuit configuration nearby the input/output circuit unit 1317 of the first chip in the circuit configuration shown in FIG. 15. In FIG. 16, reference numeral 1601 denotes each circuit element in an input/output circuit unit and 1602 denotes an inter-chip signal connection point with the second chip 1320 of each circuit element. Power is supplied to each circuit element 1601 from the power supply wiring 1512 and ground wiring 1513. Reference numeral 1603 denotes a connection point of the power supply wiring 1318 for supplying a power supply potential to the internal circuit unit 1521 of the second chip and 1604 denotes a connection point of the ground wiring 1319 for supplying a ground potential to the internal circuit unit 1521 of the second chip. The connection points 1603 and 1604 are formed between the input/output circuit unit 1317 of the first chip and the external connection point (bonding pad 1131).

Reference numeral 1605 denotes a connection point with the power supply wiring 1523 for supplying a power supply potential to the input/output circuit unit 1522 of the second chip in the power supply wiring 1512. A plurality of connection points 1605 are formed on the power supply wiring 1512. Preferably, the connection points 1605 of the power supply wiring are arranged between inter-chip signal connection points 1602. The ground wiring 1513 is similarly constituted. Reference numeral 1606 denotes a connection point with the ground wiring 1524 for supplying a ground potential to the input/output circuit unit 1522 of the second chip in the ground wiring 1513. A plurality of connection points are formed on the ground wiring 1513. Preferably, a ground connection point 1606 is set between the inter-chip signal connection points 1602. Thus, by forming a plurality of inter-chip connection points and a plurality of inter-chip connection wirings between input/output circuit units of the first and second chips for a power supply wiring or ground wiring, it is possible to decrease the parasitic resistance between the input/output circuit units of the first and second chips.

In FIGS. 11 to 15, a circuit configuration of SIP is described. In FIGS. 11 to 15, it is possible to form a protection circuit between different power supply and ground in a chip, between different power supply and power supply in the chip, or between different ground and ground. Though these are omitted in the above description, it is of course possible to apply the present invention to these circuit configurations respectively having a protection circuit.

That is, according to the present invention, it is possible to obtain the LSI which achieves the high ESD tolerance.

It is apparent that the present invention is not limited to the above embodiments, but may be modified and changed without departing from the scope and spirit of the invention.

What is claimed is:

1. A system-in-package type semiconductor device having a first chip and a second chip to be mounted on one package, wherein the first chip includes a first interface circuit unit and a first power supply wiring for transmitting power to the first interface circuit unit, the second chip includes a second internal circuit unit, a second power supply wiring for supplying power to the second internal circuit unit, and a second interface circuit unit, the first interface circuit unit and the second internal circuit unit perform input and/or output of signals through the second interface circuit unit, a wiring route for supplying power to the first and second interface circuit units is formed from the first power supply wiring, and a wiring route for connecting the first power supply wiring with the second power supply wiring to bypass the first and second interface circuit units is formed.

2. The system-in-package type semiconductor device according to claim 1, wherein the first power supply wiring and the second power supply wiring are connected through a protection circuit.

3. The system-in-package type semiconductor device according to claim 1, wherein the first power supply wiring and the second power supply wiring are connected without through a protection circuit, and they belong to a common power supply system.

4. The system-in-package type semiconductor device according to claim 3, wherein wiring routes for supplying power to the first and second interface circuit units and the second power supply wiring are connected through a protection circuit.

5. The system-in-package type semiconductor device according to claim 3, wherein a connection point between a wiring route for connecting the first power supply wiring with the second power supply wiring to bypass the first and second interface circuit units and the first power supply wiring is present between the first interface circuit unit and an external terminal to which the first power supply wiring is connected.

6. The system-in-package type semiconductor device according to claim 3, wherein a plurality of connection points for supplying power to the first and second interface circuit units are formed on the first power supply wiring.

7. A system-in-package type semiconductor device having a first chip and a second chip to be mounted on one package, wherein the first chip includes a first interface circuit unit and a power supply wiring connected to the first interface circuit unit to supply power to the first interface circuit unit, the second chip includes a second interface circuit unit which performs input and/or output of signals with the first interface circuit unit and to which power is supplied through the power supply wiring, and the power supply wiring includes a plurality of connection points for supplying power to the second interface circuit unit.

* * * * *